United States Patent
Nakagawa

(10) Patent No.: US 9,704,777 B2
(45) Date of Patent: Jul. 11, 2017

(54) ELECTRIC POWER CONVERTER AND METHOD FOR MANUFACTURING THE SAME

(71) Applicant: DENSO CORPORATION, Kariya, Aichi-pref. (JP)

(72) Inventor: Eiji Nakagawa, Kariya (JP)

(73) Assignee: DENSO CORPORATION, Kariya (JP)

( * ) Notice: Subject to any disclaimer, the term of this patent is extended or adjusted under 35 U.S.C. 154(b) by 30 days.

(21) Appl. No.: 14/852,909

(22) Filed: Sep. 14, 2015

(65) Prior Publication Data
US 2016/0079145 A1    Mar. 17, 2016

(30) Foreign Application Priority Data
Sep. 12, 2014 (JP) .................. 2014-186272

(51) Int. Cl.
*H01L 23/48* (2006.01)
*H01L 23/427* (2006.01)
(Continued)

(52) U.S. Cl.
CPC ............ *H01L 23/4012* (2013.01); *G06F 1/20* (2013.01); *H01L 23/40* (2013.01);
(Continued)

(58) Field of Classification Search
CPC ............. H01L 23/481; H01L 23/427; H01L 23/49883; H01L 23/488; H01L 23/36; H01L 23/4012; H01L 23/40; H01L 23/4006; H01L 23/473; H01L 2924/0002; H01L 2023/4087; H01L 2924/00; G06F 1/20; G06F 1/203; G06F 2200/201; H05K 1/14; H05K 1/118; H05K 7/20927; H05K 3/368; H05K 1/0298

See application file for complete search history.

(56) References Cited

U.S. PATENT DOCUMENTS 8,929,097 B2 * 1/2015 Nakasaka ............ H01L 23/473
                                                361/688
9,219,425 B2 * 12/2015 Sano ..................... H02M 7/003
(Continued)

FOREIGN PATENT DOCUMENTS

| JP | 2005-143244 A | 6/2005 |
| JP | 2011-167028 A | 8/2011 |
| JP | 2013-146169 A | 7/2013 |

*Primary Examiner* — Adam B Dravininkas
(74) *Attorney, Agent, or Firm* — Oliff PLC

(57) ABSTRACT

An electric power converter includes a laminated semiconductor unit, a beam member that supports the laminated semiconductor unit from a rear end in a laminating direction, a frame, and a plurality of pressing plates. The frame that accommodates the laminated semiconductor unit, and has an insertion opening in a rear thereof in the laminating direction into which the laminated semiconductor unit can be inserted. The plurality of pressing plates are accommodated between a front wall portion of the frame and the laminated semiconductor unit, and the pressing plates press the laminated semiconductor unit in a direction from the front toward the rear. The plurality of pressing plates are laminated in the laminating direction with each other, and are compressed and elastically deformed in the laminating direction. The beam member is fixed to the frame.

6 Claims, 10 Drawing Sheets

(51) Int. Cl.
  *G06F 1/20*     (2006.01)
  *H01L 23/40*    (2006.01)
  *H01L 23/473*   (2006.01)

(52) U.S. Cl.
  CPC ........ *H01L 23/4006* (2013.01); *H01L 23/427* (2013.01); *H01L 23/473* (2013.01); *H01L 23/481* (2013.01); *H01L 2023/4087* (2013.01); *H01L 2924/0002* (2013.01)

(56) References Cited

U.S. PATENT DOCUMENTS

| | | | |
|---|---|---|---|
| 9,502,331 B2* | 11/2016 | Sano | H01L 23/473 |
| 2005/0030717 A1* | 2/2005 | Inagaki | H01L 23/4334 |
| | | | 361/699 |
| 2006/0087816 A1* | 4/2006 | Ewes | F28F 3/02 |
| | | | 361/704 |
| 2006/0284308 A1* | 12/2006 | Harada | H01L 25/072 |
| | | | 257/729 |
| 2012/0250380 A1* | 10/2012 | Ichijyo | H05K 7/20927 |
| | | | 363/123 |
| 2013/0272043 A1* | 10/2013 | Sano | H02M 7/003 |
| | | | 363/123 |
| 2014/0001630 A1* | 1/2014 | Takamura | H01L 23/433 |
| | | | 257/719 |
| 2014/0098496 A1* | 4/2014 | Nakasaka | H01L 23/473 |
| | | | 361/699 |
| 2015/0195957 A1* | 7/2015 | Ohoka | H05K 7/20927 |
| | | | 361/702 |

* cited by examiner

ELECTRIC POWER CONVERTER AND METHOD FOR MANUFACTURING THE SAME

CROSS-REFERENCE TO RELATED APPLICATION

This application is based on and claims the benefit of priority from earlier Japanese Patent Application No. 2014-186272 filed Sep. 12, 2014, the description of which is incorporated herein by reference.

TECHNICAL FIELD

The present disclosure relates to an electric power converter and a method of manufacturing the same having a pressing plate for pressing a laminated semiconductor unit in a laminating direction.

BACKGROUND

An electric power converter for converting DC power from a battery into AC power for driving a motor is mounted in an electric vehicle, a hybrid vehicle or the like.

The electric power converter has a plurality of semiconductor modules with built-in switching elements, and the semiconductor modules generate heat by a controlled current flowing through the switching elements.

In such an electric power converter, a laminated semiconductor unit is formed by alternately laminating the semiconductor modules and cooling pipes for cooling the semiconductor modules.

A pressing member for pressing the laminated semiconductor unit in a laminating direction is disposed at an end in the laminating direction of the laminated semiconductor unit, and these components are disposed in a frame.

Then, cooling efficiency is improved by making the semiconductor modules and the cooling pipes in close contact by an urging force of the pressing member.

Here, in terms of a coolability of the semiconductor module, and in terms of a rigidity of the laminated semiconductor unit, the urging force of the pressing member is required to be in a certain range.

However, the urging force of the pressing member depends on spring characteristics of the pressing member, an elastic deformation amount of the pressing member, or the like.

Further, the elastic deformation amount of the pressing member depends on dimensions of a case in the laminating direction, dimensions of the laminated semiconductor unit in the laminating direction, or the like.

Therefore, when design errors occur to them, an error occurs in the urging force of the pressing member as well.

In particular, since the dimensional errors of a plurality of semiconductor modules and the dimensional errors of a plurality of cooling pipes are accumulated, design errors tend to occur in the dimensions of the laminated semiconductor unit in the laminating direction, and in accordance with this, errors in the urging force of the pressing member tend to occur as well.

Therefore, an electric power converter disclosed in the Japanese Patent Application Laid-Open Publication No. 2013-146169 supports a pressing member by using cylindrical struts that are detachable with respect to a frame.

Then, by preparing a plurality of types of struts having various diameters, and by selecting appropriate struts among them in accordance with dimensions of a laminated semiconductor unit in a laminating direction, dimensional errors of the laminated semiconductor unit in the laminating direction are absorbed, and urging force of a pressing member is adjusted.

However, the electric power converter disclosed in the Publication No. '169 must provide the plurality of types of struts of different diameters as described above.

Therefore, there is a problem that it is difficult to improve the productivity of the electric power converter, and cost reduction is also difficult to achieve.

SUMMARY

An embodiment provides an electric power converter and a method of manufacturing the same that can easily adjust the pressing force acting on a laminated semiconductor unit while achieving an improved productivity and a cost reduction.

An electric power converter according to an aspect includes a laminated semiconductor unit, a beam member that supports the laminated semiconductor unit from a rear end in a laminating direction, a frame, and a plurality of pressing plates.

The frame accommodates the laminated semiconductor unit, and has an insertion opening in a rear thereof in the laminating direction into which the laminated semiconductor unit can be inserted.

The plurality of pressing plates are accommodated between a front wall portion of the frame and the laminated semiconductor unit, and the pressing plates pressing the laminated semiconductor unit in a direction from the front toward the rear.

The plurality of pressing plates are laminated in the laminating direction with each other, and are compressed and elastically deformed in the laminating direction.

The beam member is fixed to the frame.

A method of manufacturing the electric power converter according to an aspect includes a first step of inserting and placing the laminated semiconductor unit from the insertion opening into the frame, then bringing the beam member into contact with the rear end of the frame.

The method further includes a second step of measuring a gap dimension between a front end of the laminated semiconductor unit and the front wall portion in a condition where the laminated semiconductor unit is pressed in the laminating direction from the front toward the rear with a predetermined pressing force.

The method further includes a third step of selecting an appropriate number of the pressing plates in accordance with the gap dimension that is measured in the second step, and disposing the plurality of the pressing plates inside the frame.

The method further includes a fourth step of moving the laminated semiconductor unit forward in the frame so as to sandwich the plurality of pressing plates between the front wall portion and the laminated semiconductor unit and so as to elastically compress them, and fixing the beam member to the frame in a condition where the beam member abuts against the rear end of the frame.

The electric power converter is composed by disposing the plurality of pressing plates between the front wall portion of the frame and the laminated semiconductor unit.

Therefore, by adjusting the number of the pressing plates to be laminated, it is possible to easily adjust the pressing force acting on the laminated semiconductor unit.

Moreover, since it is possible to adjust the pressing force by changing the number of the pressing plates, there is no need to prepare many kinds of pressing plates.

Therefore, it is possible to achieve an improvement of the productivity and cost reduction of the electric power converter.

Furthermore, in the manufacturing method of the electric power converter, from the first step to the fourth step are performed.

In other words, the gap dimension is measured in the second step and in accordance with the gap dimension, the appropriate number of the pressing plates is selected in the third step, and the selected number of the pressing plates is laminated and disposed between the laminated semiconductor unit and the front wall portion.

Thereby, the pressing force acting on the laminated semiconductor unit can be easily adjusted, and it is possible to easily manufacture the electric power converter.

As described above, according to the present disclosure, the electric power converter and a method of manufacturing the same that can easily adjust the pressing force acting on the laminated semiconductor unit while achieving the improved productivity and the cost reduction can be provided.

BRIEF DESCRIPTION OF THE DRAWINGS

In the accompanying drawings.

DETAILED DESCRIPTION OF THE PREFERRED EMBODIMENTS

Figure 1:
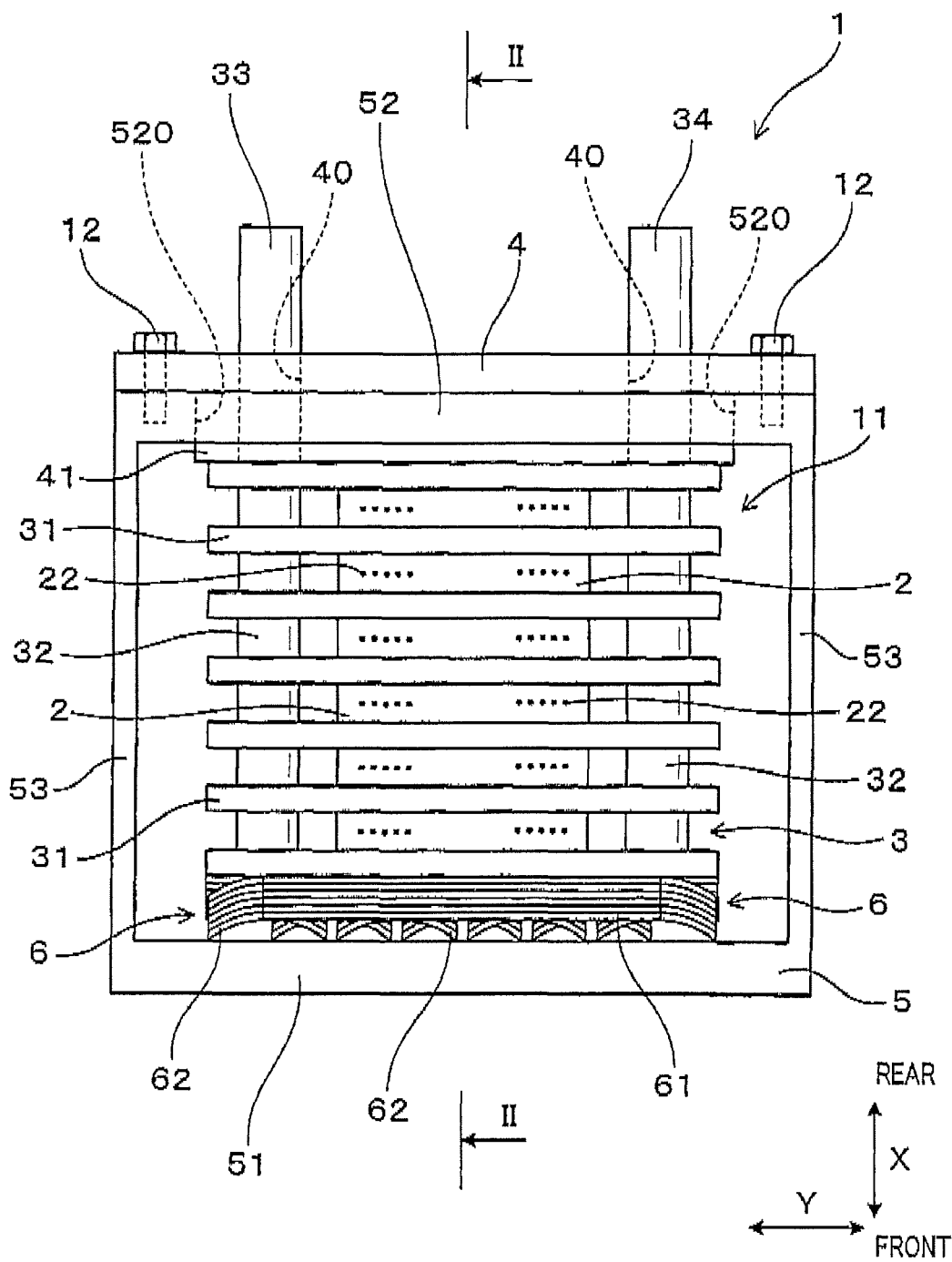
FIG. 1 shows a top view of an electric power converter in a first embodiment.

An electric power converter is mounted on an electric or hybrid vehicle, for example, and can perform power conversion between DC power supply and a three-phase AC rotating electrical machine as a driving source of a vehicle.

In the present specification, for convenience, a laminated semiconductor unit has a length in a laminating direction, and one end of the length is defined as a first end, while an opposite end is defined as a second end. Particularly in FIG. 1, a bottom of the drawing is the first to end and the top of the drawing is the second end. More particularly, in the present specification, the first end is a front and the second end is a rear of the laminated semiconductor unit.

EMBODIMENTS

First Embodiment

An embodiment of an electric power converter will be described with reference to FIGS. 1 to 10.

Figure 2:
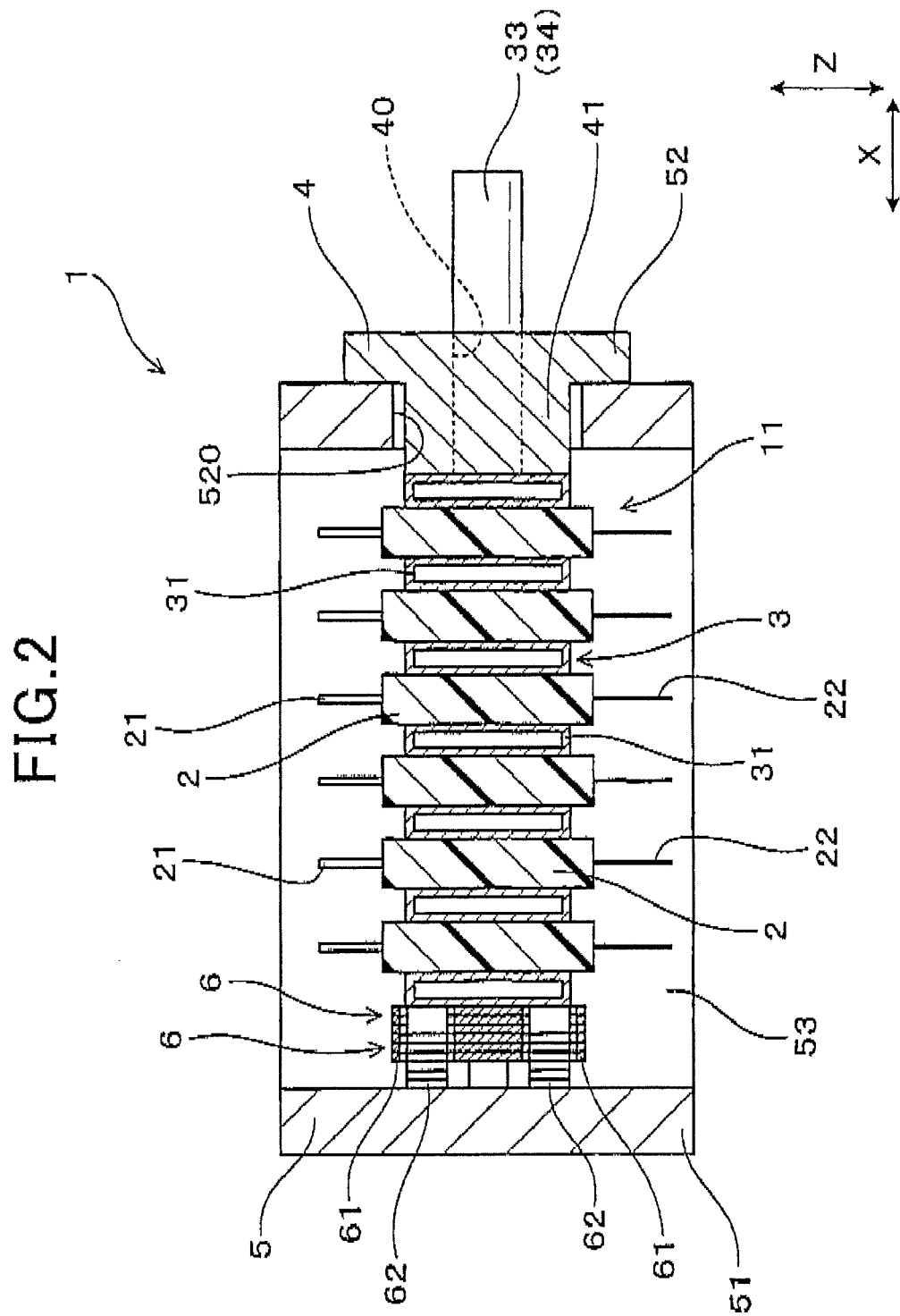
FIG. 2 shows a sectional view taken along the line II-II in FIG. 1.

An electric power converter 1 of the present embodiment includes a laminated semiconductor unit 11 formed by laminating semiconductor modules 2 and cooling pipes 31 that cool the semiconductor modules 2, a beam member 4 that supports the laminated semiconductor unit 11 from a rear end (second end) in a laminating direction X, a frame 5, and a plurality of pressing plates 6, as shown in FIGS. 1 and 2.

Figure 3:
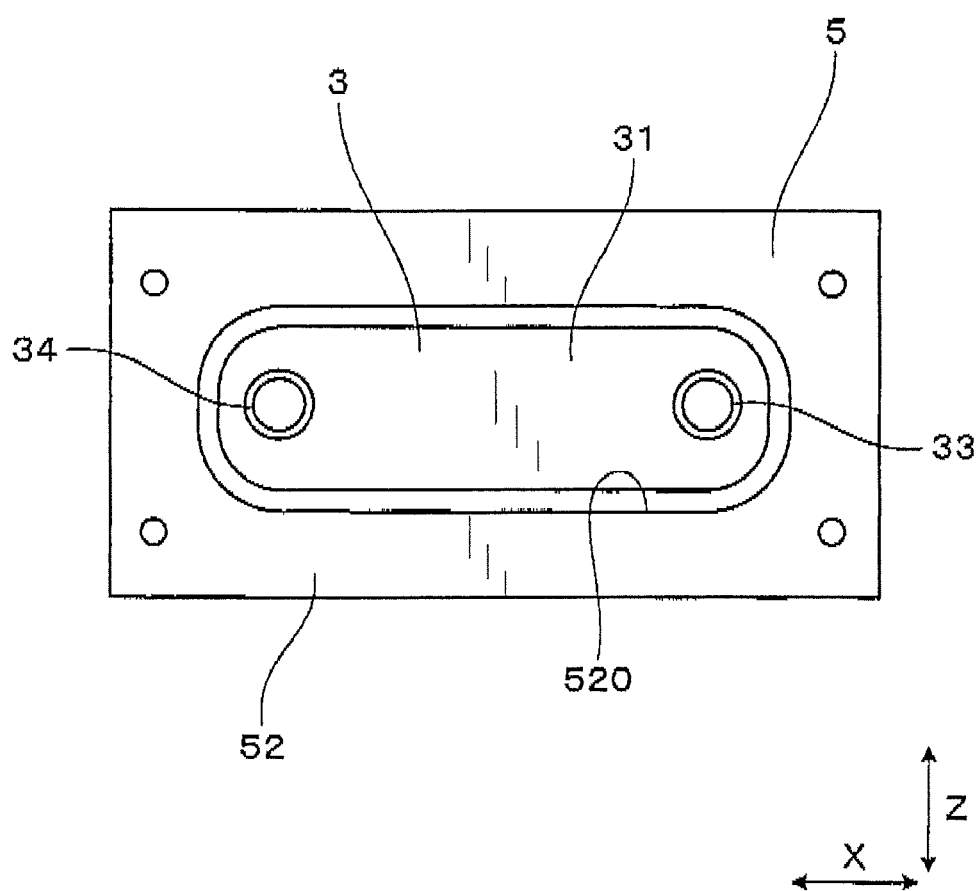
FIG. 3 shows a view of a frame and a cooler seen from an insertion opening side in a laminating direction in the first embodiment.

As shown in FIGS. 1 to 3, the frame 5 accommodates the laminated semiconductor unit 11, and has an insertion opening 520 in the rear thereof in the laminating direction X where the laminated semiconductor unit 11 can be inserted into.

As shown in FIGS. 1 and 2, the plurality of pressing plates 6 are accommodated between a front wall portion 51 of the frame 5 and the laminated semiconductor unit 11, and the pressing plates 6 press the laminated semiconductor unit 11 in a direction from the front toward the rear (first end toward second end).

The plurality of pressing plates 6 are laminated in the laminating direction X with each other, and are compressed and elastically deformed in the laminating direction X.

The beam member 4 is fixed to the frame 5.

The laminated semiconductor unit 11 is formed by alternately laminating the plurality of semiconductor modules 2 and the plurality of cooling pipes 31.

Each semiconductor module 2 is sandwiched by the cooling pipes 31 from both sides in the laminating direction X.

Each semiconductor module 2 is composed of integrating a switching element such as an IGBT (insulated gate bipolar transistor), or a diode such as an FWD (free wheel diodes).

Further, as shown in FIG. 2, each semiconductor module 2 has power terminals 21 and control terminals 22 projecting in opposite directions with respect to each other.

As shown in FIGS. 1 and 2, the plurality of cooling pipes 31 are longer in a direction perpendicular to the laminating direction X, and constitute a single cooler 3 by connecting the cooling pipes 31 at adjoining longitudinal ends by deformable connecting pipes 32.

It should be noted that in the following, a longitudinal direction of the cooling pipes 31 is appropriately referred to as a transverse direction Y, and a direction perpendicular to the laminating direction X and the transverse direction Y is appropriately referred to as a height direction Z.

The cooler 3 is connected with a coolant inlet pipe 33 and a coolant outlet pipe 34 at ends of the cooling pipes 31 disposed at the rear end in the laminating direction X. The coolant inlet pipe 33 introduces a coolant into the cooler 3, while the coolant outlet pipe 34 discharges the coolant from the cooler 3.

The coolant inlet pipe 33 and the coolant outlet pipe 34 are formed projecting in the laminating direction X.

The cooler 3 is made of a metal excellent in thermal conductivity such as aluminum or the like.

The coolant introduced from the coolant inlet pipe 33 passes through the connecting pipes 32 appropriately, and is distributed to each cooling pipe 31 and flows in the longitudinal direction of the cooling pipe 31.

Then, while flowing through each of the cooling pipe 31, the coolant exchanges heat with the semiconductor modules 2.

The coolant of which the temperature is raised by the heat exchange passes through the connecting pipes 32 appropriately in a downstream side, and is guided to the coolant outlet pipe 34 and discharged from the cooler 3.

As for a coolant, for example, a natural coolant such as ammonia or water, water mixed with ethylene glycol-based antifreeze, a fluorocarbon-based coolant such as FLUORINERT (registered trademark), another fluorocarbon-based coolant such as HCFC123 or HFC134a, methanol, an alcohol-based coolant such as an alcohol, or a ketone-based coolant such as acetone can be used.

As shown in FIG. 1, the laminated semiconductor unit is surrounded by the frame 5 in a direction perpendicular to the height direction Z.

That is, the frame 5 includes the front wall portion 51 and a rear wall portion 52 disposed respectively at the front and the rear of the laminated semiconductor unit 11 in the laminating direction X, and a pair of side wall portions 53 disposed so as to connect both ends of the front wall portion 51 and the rear wall portion 52.

The front wall portion 51 faces the rear wall portion 52, and the pair of side wall portions 53 are facing to each other.

The laminated semiconductor unit 11 is disposed in the frame 5 in a direction where the coolant inlet pipe 33 and the coolant outlet pipe 34 are projected to the rear wall portion 52 side.

As shown in FIGS. 1 to 3, the frame 5 has the insertion opening 520 in the rear wall portion 52.

As shown in FIG. 3, when projected onto a plane parallel to the laminating direction X, an outer shape of the insertion opening 520 has a shape in which an outer shape of the cooling pipe 31 fits inside.

As shown in FIG. 1, the insertion opening 520 is closed by the beam member 4 being fixed to the frame 5.

Figure 4:
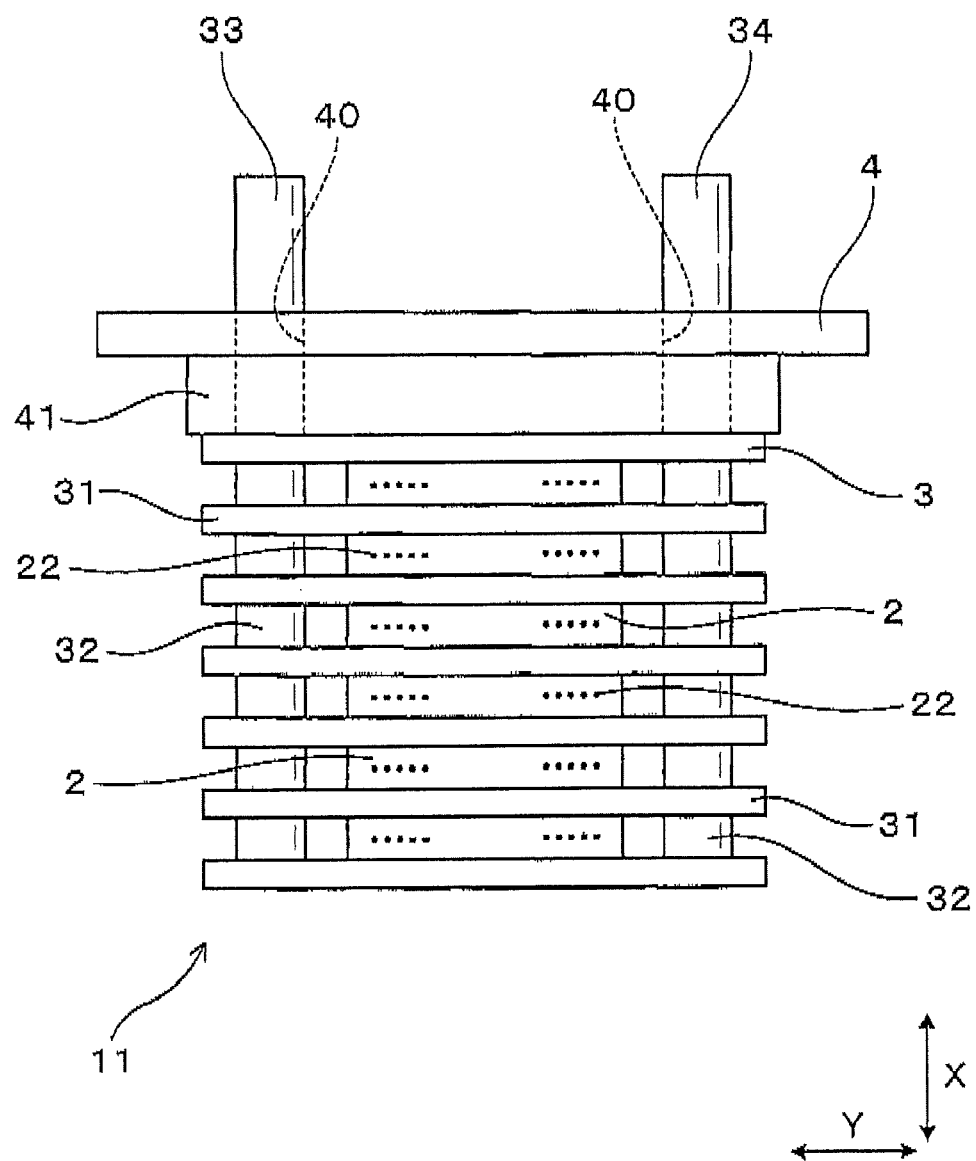
FIG. 4 shows a top view of a laminated semiconductor unit and a beam member in the first embodiment.

As shown in FIGS. 1 and 4, the beam member 4 is provided with through holes 40 for inserting the coolant inlet pipe 33 and the coolant outlet pipe 34 on both sides in the longitudinal direction.

The coolant inlet pipe 33 and the coolant outlet pipe 34 respectively penetrate the two insertion holes 40 disposed on the beam member 4.

When projected perpendicularly onto a plane parallel to the laminating direction X, an outer shape of the beam member 4 has a substantially rectangular shape to which the outer shape of the insertion opening 520 fits inside.

As shown in FIGS. 1, 2 and 4, the beam member 4 has a projecting portion 41 projecting toward the front.

When projected onto a plane parallel to the laminating direction X, the projecting portion 41 has an outer shape that fits inside the insertion opening 520.

As shown in FIG. 1, the beam member 4 is fixed to the rear wall portion 52 of the frame 5 by means of bolts 12.

The bolts 12 fasten the beam member 4 on the rear wall portion 52 in a plurality of points around the insertion opening 520 in the rear wall portion 52.

The frame 5 and the beam member 4 are made of a metal such as aluminum or iron, or made of an alloy. In FIG. 2, the bolts 12 are not shown.

As shown in FIGS. 1 and 2, the plurality of pressing plates 6 are disposed between the front wall portion 51 and the laminated semiconductor unit 11.

In the present embodiment, each of the plurality of the pressing plates 6 has substantially the same shape.

Figure 5:
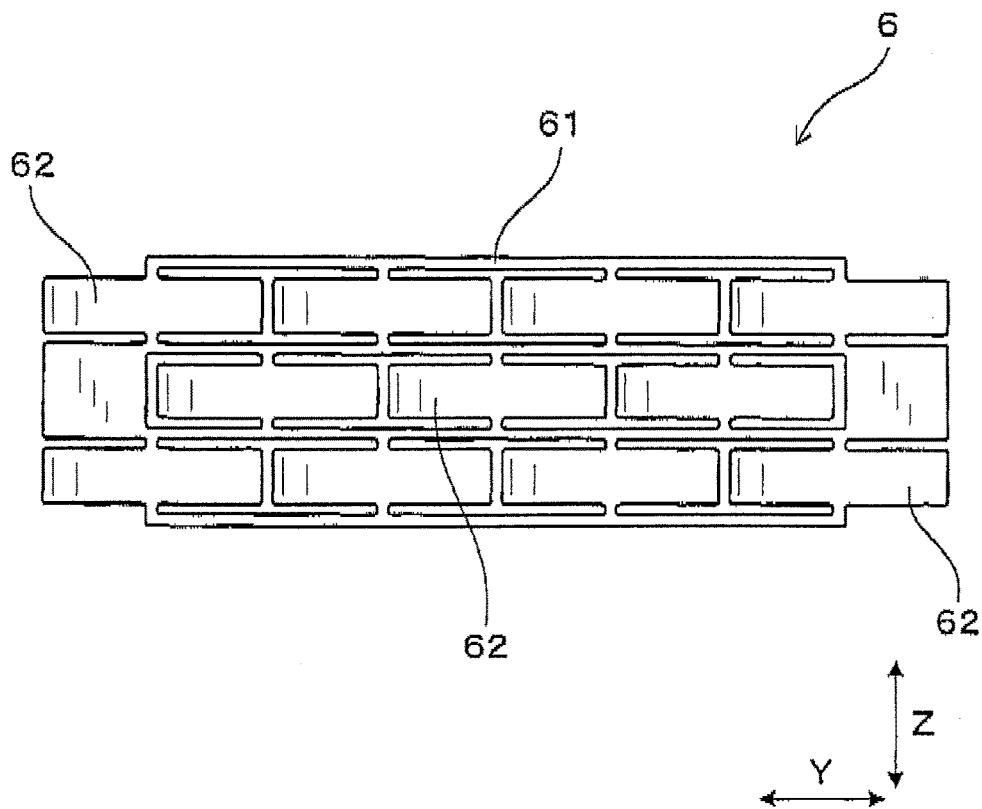
FIG. 5 shows a front view of a pressing plate in the first embodiment.

In the present embodiment, as shown in FIG. 5, the pressing plate 6 is formed of a plate-like substrate portion 61, and a plurality of elastically deformable spring portions 62 that are fixed to the substrate portion 61.

The plurality of spring portions 62 are distributed across the substrate portion 61.

Specifically, the substrate 61 is formed in a direction perpendicular to the laminating direction X, and the plurality of spring portions 62 are arranged in staggered layout.

That is, the spring portions 62 adjacent to each other in the height direction Z are disposed offset in the transverse direction Y.

Figure 6:
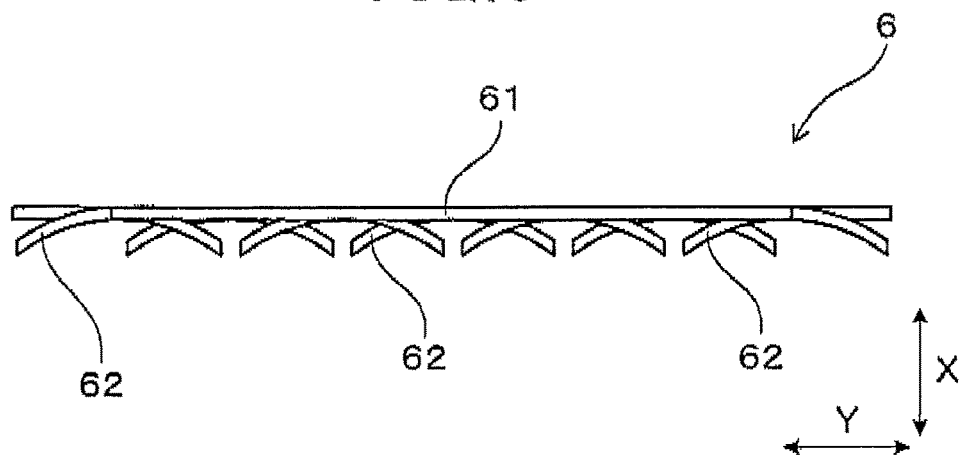
FIG. 6 shows a top view of the pressing plate in the first embodiment.

As shown in FIG. 6, each of the spring portions 62 has a generally arcuate shape when projected onto a plane parallel to the height direction Z by bending both sides in the transverse direction Y of the spring portions 62 toward the front in the laminating direction X.

As shown in FIG. 1, the plurality of pressing plates 6 are laminated in a direction of which urging force is in the laminating direction X.

The adjoining pressing plates 6 are laminated so that respective substrate portion 61 and spring portion 62 overlap with each other.

Next, a method of manufacturing the electric power converter 1 of the present embodiment will be explained.

The electric power converter 1 can be manufactured by performing the following first to fourth steps.

Figure 7:
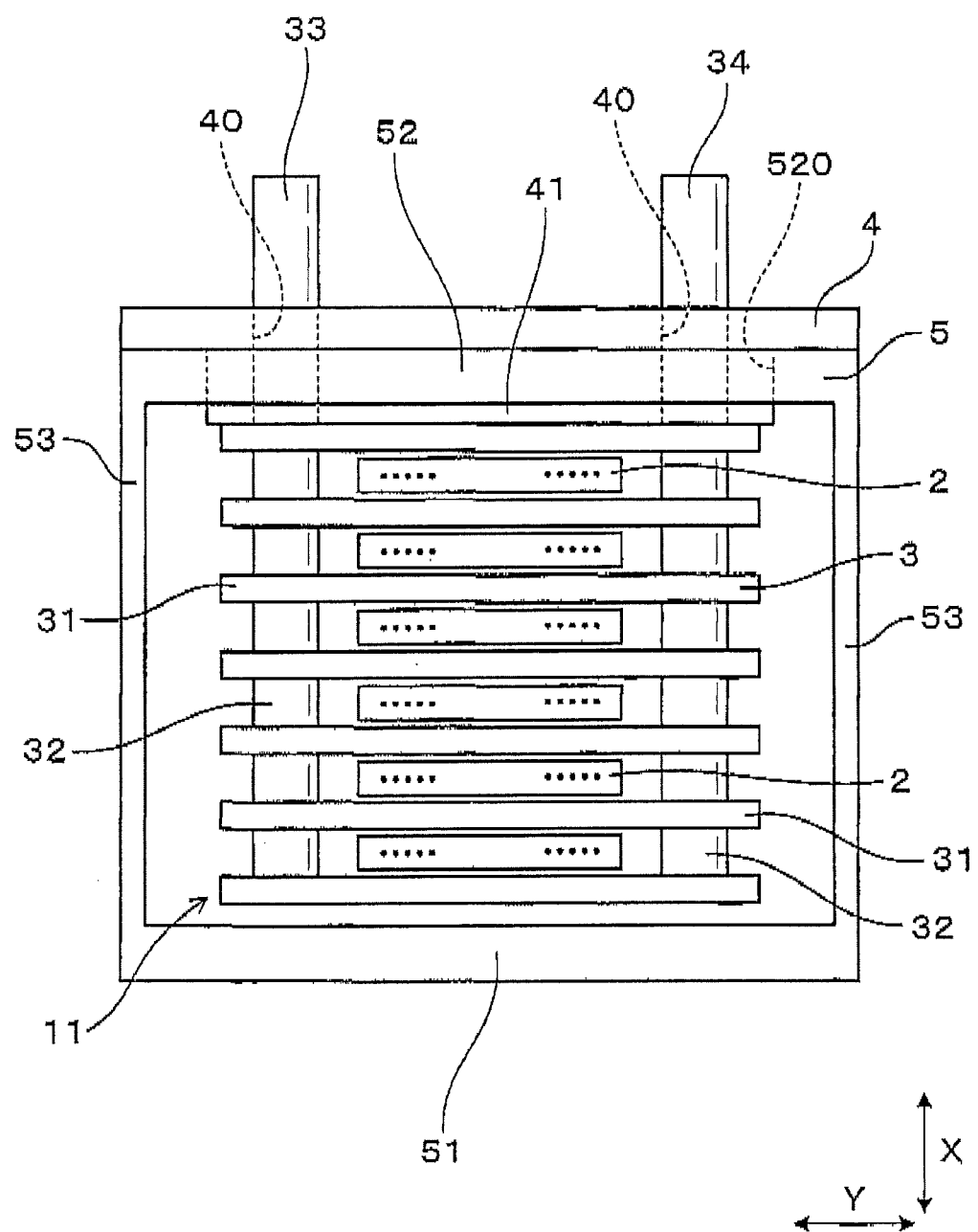
FIG. 7 shows an explanatory drawing of a first step in the first embodiment.

In the first step, as shown in FIG. 7, the laminated semiconductor unit 11 is inserted from the insertion opening 520 into the frame 5 and placed therein, then the beam member 4 is brought into contact with the rear end of the frame 5.

Figure 8:
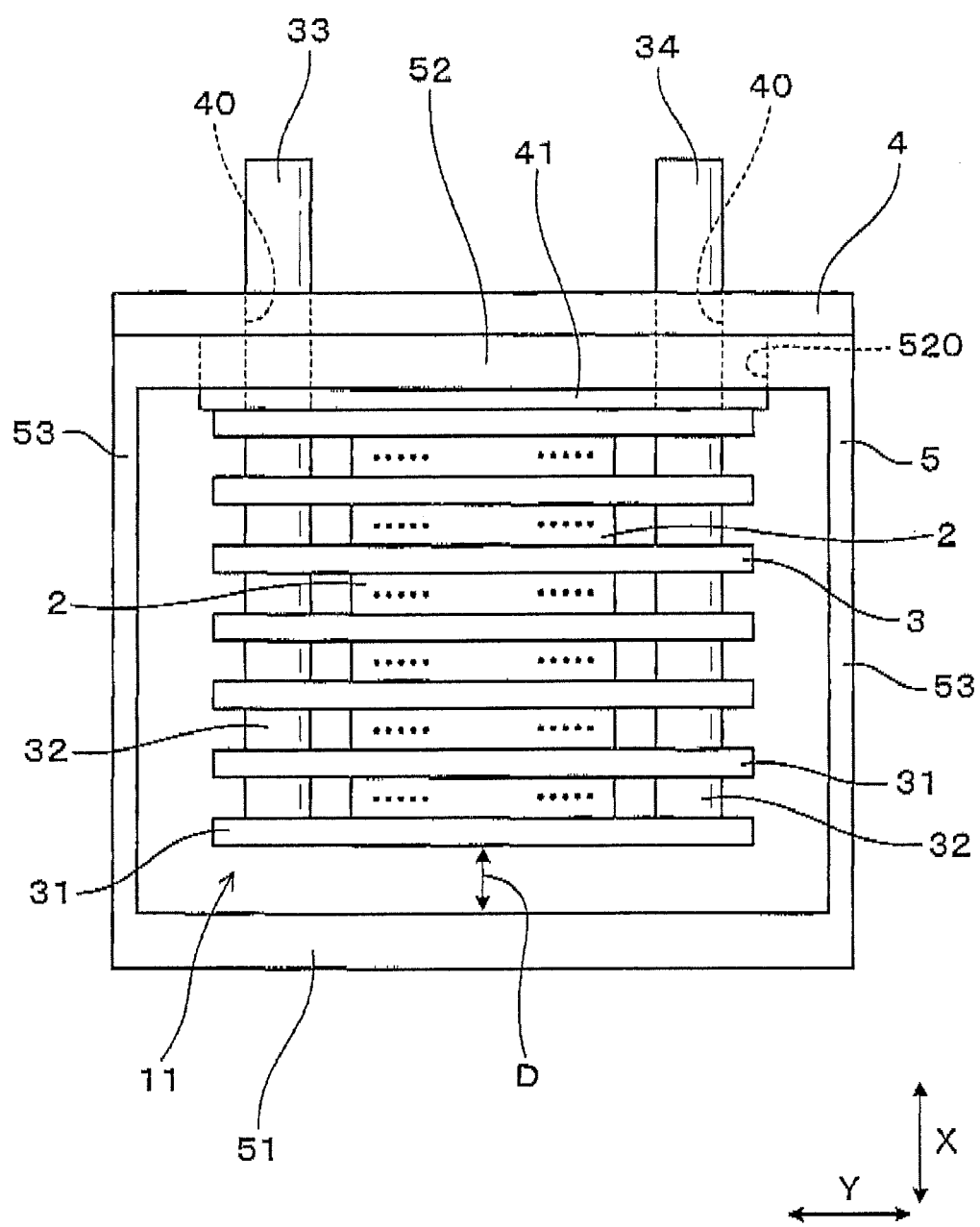
FIG. 8 shows an explanatory drawing of a second step in the first embodiment.

In the second step, as shown in FIG. 8, in a condition where the laminated semiconductor unit 11 is pressed in the laminating direction X from the front toward the rear with a predetermined pressing force, a gap dimension D between a front end of the laminated semiconductor unit 11 and the front wall portion 51 is measured.

Figure 9:
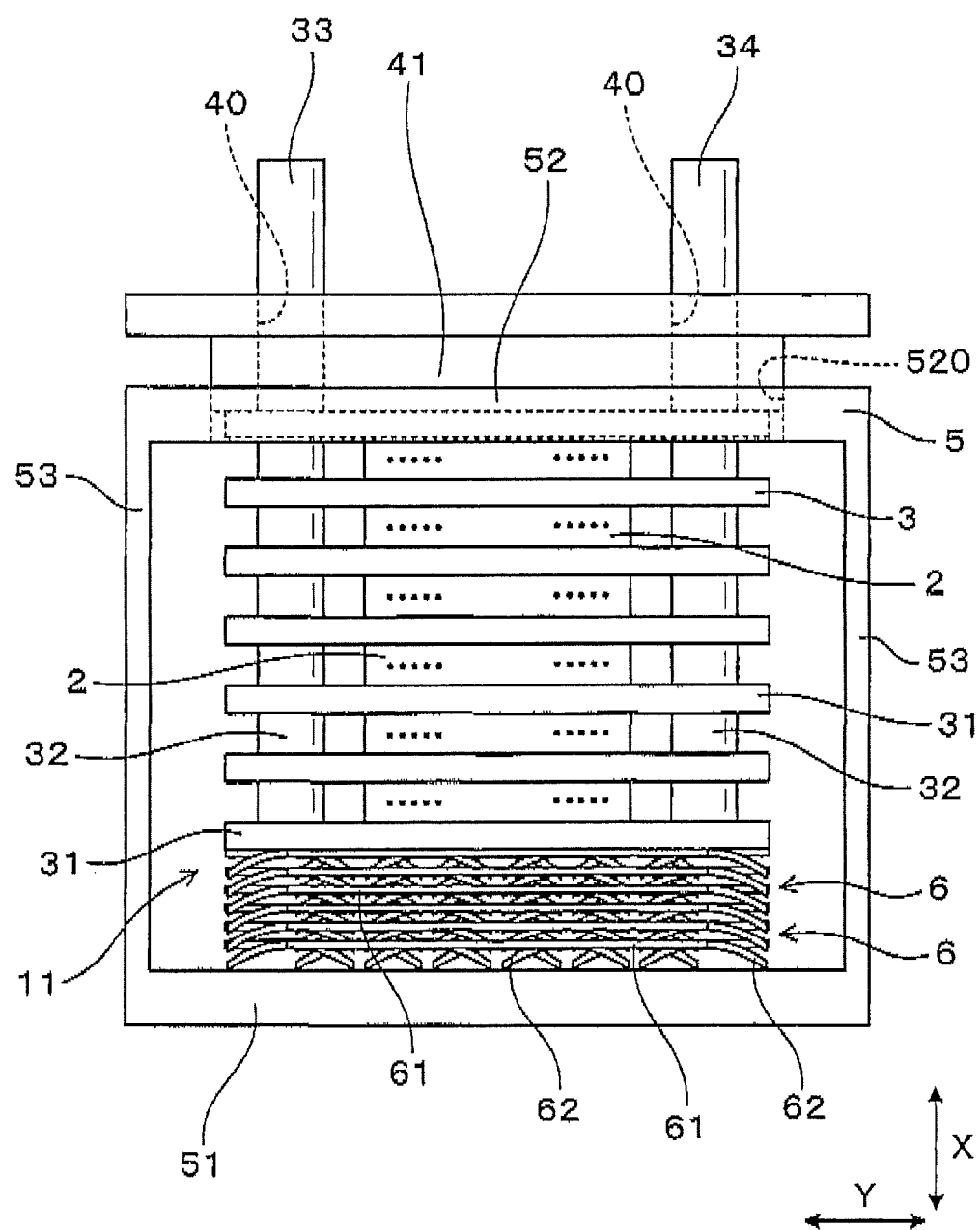
FIG. 9 shows an explanatory drawing of a third step in the first embodiment.

In the third step, as shown in FIG. 9, an appropriate number of the pressing plates 6 is selected in accordance with the gap dimension D that is measured in the second step, and the plurality of the pressing plates 6 are disposed inside the frame 5.

In the fourth step, the laminated semiconductor unit 11 is moved forward in the frame 5 so as to sandwich the plurality of pressing plates 6 between the front wall portion 51 and the laminated semiconductor unit 11 and so as to elastically compress, the beam member 4 is fixed to the frame 5 in a condition where the beam member abuts against the rear end of the frame 5.

The method of manufacturing the electric power converter 1 of the present embodiment will be explained more specifically hereinafter.

First, before the first step, as shown in FIG. 4, the coolant inlet pipe 33 and the coolant outlet pipe 34 of the laminated semiconductor unit 11 are inserted into the two through holes 40 of the beam member 4.

Thereby, the laminated semiconductor unit 11 and the beam member 4 are integrated.

Then, as shown in FIG. 7, in the first step, the laminated semiconductor unit 11 and the projecting portion 41 of the beam member 4 are inserted from the insertion opening 520 in a condition where the coolant inlet pipe 33 and the coolant outlet pipe 34 are facing rearward.

Then, the beam member 4 is brought into contact with the rear wall portion 52.

Thereby, the laminated semiconductor unit 11 is disposed inside the frame 5, and the beam member 4 is disposed inside the insertion opening 520.

Next, as shown in FIG. 8, in the second step, in a condition where the beam member 4 is fixed to the rear wall portion 52, the laminated semiconductor unit 11 is pressed from the front end toward the rear with the predetermined pressing force, for example.

Here, the predetermined pressure is a pressure such that the cooling pipes 31 and the semiconductor modules 2 are sufficiently cohered to the extent that the cooling pipes 31 and the semiconductor modules 2 are not damaged.

Then, in this condition, the gap dimension D in the laminating direction X between a front end surface of the cooling pipe 31 disposed in front most of the cooler 3 and a rear end surface of the front wall portion 51 is measured.

Next, as shown in FIG. 9, in the third step, in accordance with a dimension in the laminating direction X of the pressing plate 6 in a free state and the gap dimension D that is measured in the second step, a pressing force suitable for the laminated semiconductor unit 11, that is, the number of the pressing plates 6 that can apply the predetermined pressing force is selected.

Hereinafter, an example of selecting the number of the pressing plates 6 that can apply the predetermined pressing force will be explained with reference to FIG. 10.

In terms of a coolability of the semiconductor module 2, a minimum value of a load F applied to the laminated semiconductor unit 11 is set to F1, and in view of a withstanding load of the semiconductor modules 2 and the cooling pipes 31, a maximum value of the load F applied to the laminated semiconductor unit 11 is set to F2.

In other words, the value of the predetermined pressing force ranges from F1 to F2.

Then, considering design (or manufacturing) errors occurring to such as the laminated semiconductor unit 11 or the frame 5, the gap dimension D can vary in the range from D1 to D2.

Figure 10:
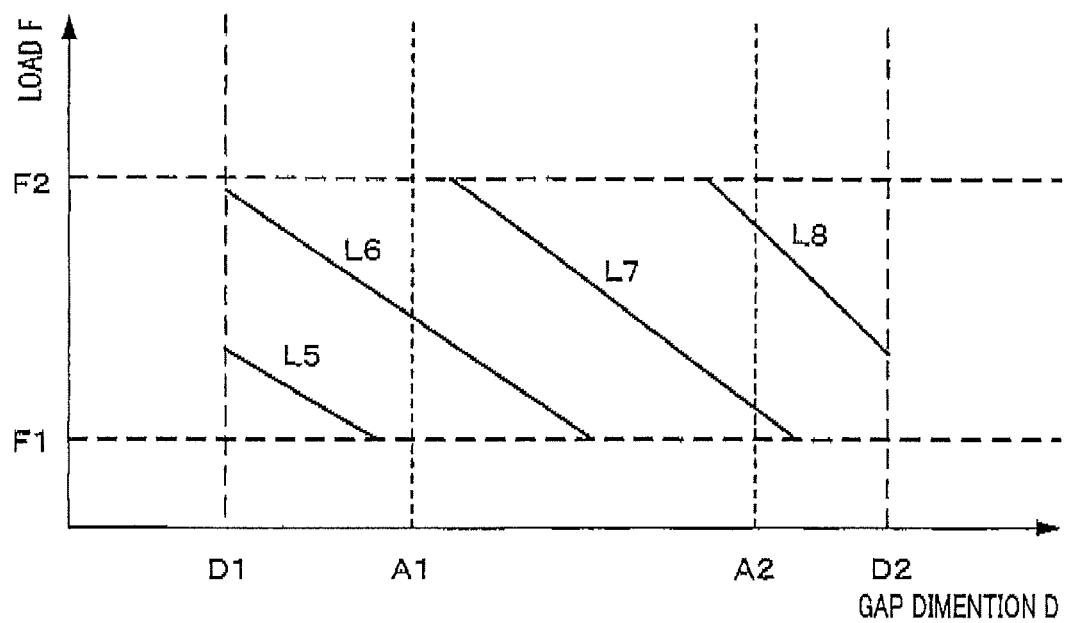
FIG. 10 shows a graph of a relationship between gap dimensions and load.

In this case, an example of a relationship between the gap dimension D and the load F when laminating 5 to 8 the pressing plates 6 and disposing them between the laminated semiconductor unit 11 and the front wall portion 51 is shown as straight lines L5 to L8 in FIG. 10.

From this graph, the number of the pressing plates 6 that can apply the predetermined pressing force to the laminated semiconductor unit 11 is selected.

For example, when a value of the gap dimension D measured in the second step is A1 shown in FIG. 10, six plates (L6) of which the value of the load F is within the range of the predetermined pressing force are selected.

Further, for example, when a value of the gap dimension D measured in the second step is A2 shown in FIG. 10, seven plates (L7) or eight plates (L8) of which values of the load F are within the range of the predetermined pressing force are selected.

As described above, the number of the pressing plates 6 that can apply the predetermined pressure is selected.

Then, the fixing of the beam member 4 and the rear wall portion 52 in the second step is loosed, and the beam member 4 and the semiconductor laminated unit 11 are shifted to the rear side in the laminating direction X.

At this time, it is configured that a dimension in the laminating direction X between the front end surface of the cooling pipe 31 disposed in front most of the cooler 3 and the rear end surface of the front wall portion 51 becomes larger than a dimension in the laminating direction X of the selected number of the pressing plates 6 in the free state.

Then, as shown in FIG. 9, the selected number of the pressing plates 6 are laminated and disposed between the laminated semiconductor unit 11 and the front wall portion 51.

Next, in the fourth step, the laminated semiconductor unit 11 is compressed while sandwiching and compressing the plurality of pressing plates 6 between the rear end of the front wall portion 51 and the front end of the laminated semiconductor unit 11 by moving the beam member 4 forward.

That is, by pressing the beam member 4 forward, while elastically deforming the spring portions 62 of the plurality of pressing plates 6 in the laminating direction X, the beam member 4 is abutted to the rear wall portion 52.

Then, the beam member 4 is fixed to the rear wall portion 52 by the bolts 12.

Thereby, the beam member 4 is fastened and fixed to frame 5 in a condition where the plurality of pressing plates 6 are urged toward the laminated semiconductor unit 11 side.

Accordingly, the laminated semiconductor unit 11 and the plurality of pressing plate 6 are disposed in the frame 5.

Thus, the electric power converter 1 is assembled.

At least between the first step and the fourth step, the laminated semiconductor unit 11 and the beam member 4 are in the condition of being integrated.

An integration referred to herein is intended to refer to a condition in which the coolant inlet pipe 33 and the coolant outlet pipe 34 of the laminated semiconductor unit 11 are inserted into the through holes 40 of the beam member 4.

Next, functions and effects of the present embodiment are explained.

The electric power converter 1 is composed by disposing the plurality of pressing plates 6 between the front wall portion 51 of the frame 5 and the laminated semiconductor unit 11.

Therefore, by adjusting the number of the pressing plates 6 to be laminated, it is possible to easily adjust the pressing force acting on the laminated semiconductor unit 11.

Moreover, since it is possible to adjust the pressing force by adjusting the number of the pressing plate 6, there is no need to prepare many kinds of pressing plates 6.

Therefore, it is possible to achieve an improvement of the productivity and cost reduction of the electric power converter 1.

Further, the pressing plate 6 is made of the plate-like substrate portion 61, and the plurality of elastically deformable spring portions 62 that are fixed to the substrate portion 61, and the plurality of springs 62 are distributed across the substrate portion 61.

Thus, it is possible to apply a uniform urging force across the substrate to the laminated semiconductor unit 11.

Furthermore, in the manufacturing method of the electric power converter 1 of the present embodiment, from the first step to the fourth step are performed.

Then, the gap dimension D is measured in the second step and in accordance with the gap dimension D, appropriate number of the pressing plates 6 is selected in the third step, and the selected number of the pressing plates 6 is laminated and disposed between the laminated semiconductor unit 11 and the front wall portion 51.

Thereby, the pressing force acting on the laminated semiconductor unit 11 can be easily adjusted, and it is possible to easily manufacture the electric power converter 1.

In addition, since the laminated semiconductor unit 11 and the beam member 4 are in the condition of being integrated at least between the first step and the fourth step, it is possible to more easily manufacture the electric power converter 1.

As described above, according to the present embodiment, the electric power converter and the method of manufacturing the same that can easily adjust the pressing force acting on the laminated semiconductor unit while achieving the improved productivity and the cost reduction can be provided.

Second Embodiment

Figure 11:
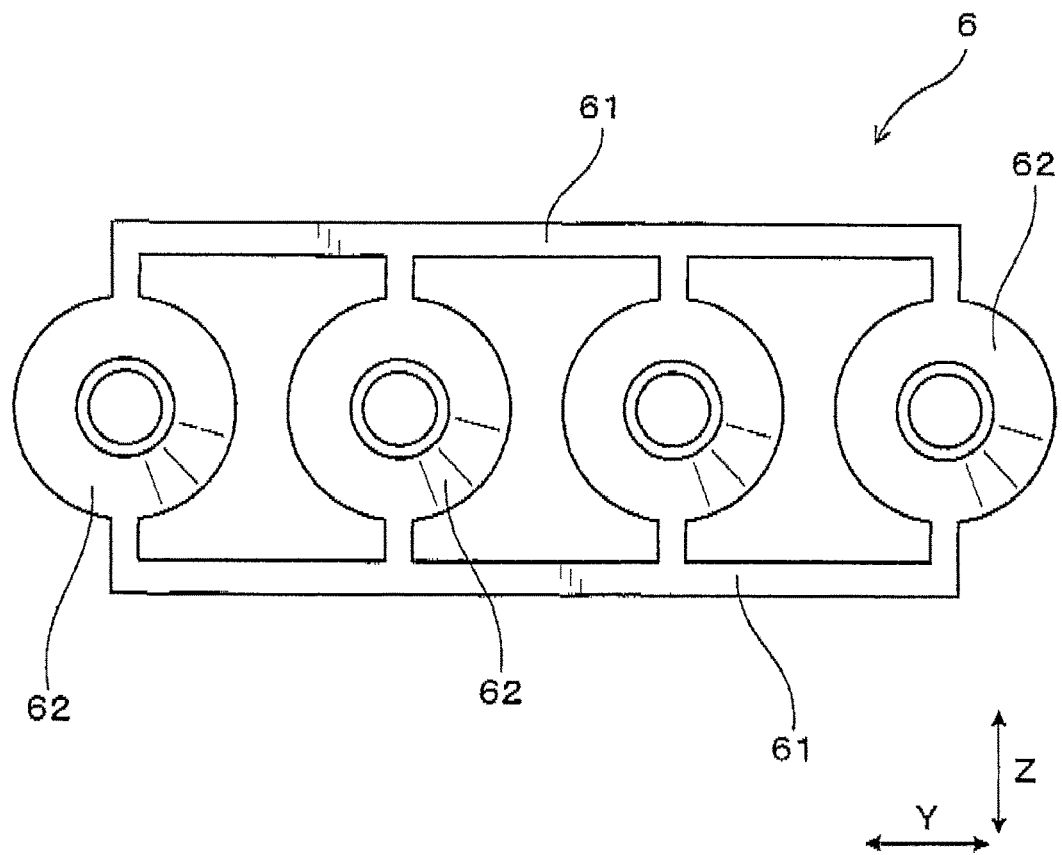
FIG. 11 shows a front view of a pressing plate in a second embodiment.
Figure 12:
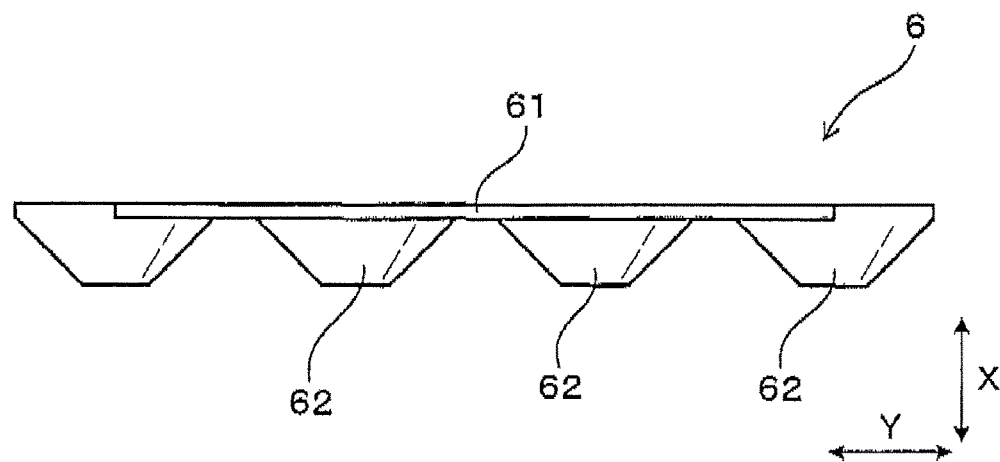
FIG. 12 shows a top view of the pressing plate in the second embodiment.

As shown in FIGS. 11 and 12, the present embodiment is an example that a shape of the pressing plate 6 is changed.

In the present embodiment, the spring portion 62 is configured by a disc spring.

A plurality of spring portions 62 are aligned in a straight line in the transverse direction Y.

The plurality of springs 62 are connected to the substrate portion 61 at both ends in the height direction Z.

The rest is the same as in the first embodiment.

It should be noted that among the reference numerals used in the drawings of the present embodiment or the drawings related to the present embodiment, the same reference numerals as used in the first embodiment represent the same elements as the first embodiment unless otherwise indicated.

The present embodiment has the same functions and effects as in the first embodiment.

It should be noted that the shape of the pressing plate in the present disclosure is not limited to those shown in the above embodiments, and may have various forms.

Further, although nothing is interposed between the plurality of pressing plates in the above embodiments, the present disclosure is not limited thereto.

That is, flat plates may be interposed between the plurality of pressing plates, for example.

Further, a flat plate may be interposed between the plurality of the pressing plates and the front wall portion or the laminated semiconductor unit.

What is claimed is:

1. An electric power converter comprising:
a laminated semiconductor unit formed by laminating semiconductor modules and cooling pipes that cool the semiconductor modules, the laminated semiconductor unit having a length in a laminating direction, and one end of the length is defined as a first end, while an opposite end is defined as a second end;
a beam member that supports the laminated semiconductor unit from the second end in a laminating direction;
a frame that accommodates the laminated semiconductor unit, and has an insertion opening in a second end side thereof in the laminating direction into which the laminated semiconductor unit can be inserted; and
a plurality of pressing plates that are accommodated between a wall portion disposed in a first end side of the frame and the laminated semiconductor unit, the pressing plates pressing the laminated semiconductor unit in a direction from the first end toward the second end; wherein,
the plurality of pressing plates are laminated in the laminating direction with each other, and are compressed and elastically deformed in the laminating direction; and
the beam member is fixed to the frame.
2. The electric power converter according to claim 1, wherein,
each of the pressing plates is formed of a plate-like substrate portion and a plurality of elastically deformable spring portions that are fixed to the substrate portion; and
the plurality of spring portions are distributed across the substrate portion.
3. A method of manufacturing the electric power converter according to claim 1, comprising:
a first step of inserting and placing the laminated semiconductor unit from the insertion opening into the frame, then bringing the beam member into contact with the second end of the frame;
a second step of measuring a gap dimension between a first end of the laminated semiconductor unit and the wall portion disposed in the first end side of the frame in a condition where the laminated semiconductor unit is pressed in the laminating direction from the first end toward the second end with a predetermined pressing force;
a third step of selecting an appropriate number of the pressing plates in accordance with the gap dimension that is measured in the second step, and disposing the plurality of the pressing plates inside the frame; and
a fourth step of moving the laminated semiconductor unit towards the first end in the frame so as to sandwich the plurality of pressing plates between the wall portion disposed in the first end side of the frame and the laminated semiconductor unit and so as to elastically compress them, and fixing the beam member to the frame in a condition where the beam member abuts against the second end of the frame.
4. A method of manufacturing the electric power converter according to claim 2, comprising:
a first step of inserting and placing the laminated semiconductor unit from the insertion opening into the frame, then bringing the beam member into contact with the second end of the frame;
a second step of measuring a gap dimension between a first end of the laminated semiconductor unit and the wall portion disposed in the first end side of the frame in a condition where the laminated semiconductor unit is pressed in the laminating direction from the first end toward the second end with a predetermined pressing force;
a third step of selecting an appropriate number of the pressing plates in accordance with the gap dimension that is measured in the second step, and disposing the plurality of the pressing plates inside the frame; and
a fourth step of moving the laminated semiconductor unit towards the first end in the frame so as to sandwich the plurality of pressing plates between the wall portion disposed in the first end side of the frame and the laminated semiconductor unit and so as to elastically compress them, and fixing the beam member to the frame in a condition where the beam member abuts against the second end of the frame.
5. The method for manufacturing the electric power converter according to claim 3, wherein,
the laminated semiconductor unit and the beam member are in a condition of being integrated at least between the first step and the fourth step.
6. The method for manufacturing the electric power converter according to claim 4, wherein,
the laminated semiconductor unit and the beam member are in a condition of being integrated at least between the first step and the fourth step.

* * * * *